(12) United States Patent
Lin et al.

(10) Patent No.: US 9,601,517 B2
(45) Date of Patent: Mar. 21, 2017

(54) HYBRID PIXEL CONTROL CIRCUITS FOR LIGHT-EMITTING DIODE DISPLAY

(71) Applicant: Apple Inc., Cupertino, CA (US)

(72) Inventors: Chin-Wei Lin, Cupertino, CA (US); Shih Chang Chang, Cupertino, CA (US); Vasudha Gupta, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 14/504,261

(22) Filed: Oct. 1, 2014

(65) Prior Publication Data
US 2016/0099262 A1    Apr. 7, 2016

(51) Int. Cl.
| H01L 27/12 | (2006.01) |
| H01L 27/32 | (2006.01) |
| H01L 27/15 | (2006.01) |
| G09G 3/32  | (2016.01) |

(52) U.S. Cl.
CPC .......... *H01L 27/1225* (2013.01); *G09G 3/32* (2013.01); *H01L 27/124* (2013.01); *H01L 27/1222* (2013.01); *H01L 27/156* (2013.01); *H01L 27/3255* (2013.01); *G09G 2300/0426* (2013.01); *G09G 2300/0842* (2013.01); *G09G 2300/0861* (2013.01)

(58) Field of Classification Search
CPC .............. H01L 27/3255; G09G 2300/0426
See application file for complete search history.

(56) References Cited

U.S. PATENT DOCUMENTS

| 6,698,077 | B2 * | 3/2004 | Buchwalter ........... G02F 1/1362 29/423 |
| 8,115,380 | B2 | 2/2012 | Cok et al. |
| 2005/0105031 | A1 | 5/2005 | Shih et al. |
| 2006/0270079 | A1 * | 11/2006 | Liu ..................... H01L 21/4853 438/27 |
| 2010/0123694 | A1 | 5/2010 | Cok et al. |
| 2011/0043499 | A1 * | 2/2011 | Cok ....................... G09G 3/006 345/205 |
| 2011/0115839 | A1 | 5/2011 | Takahashi et al. |

(Continued)

OTHER PUBLICATIONS

Griffin et al., "Micro-pixellated flip-chip InGaN and AlInGaN light-emitting diodes", p. 1-2, Conference on Lasers and Electro-Optics, May 6-11, 2007, Baltimore, MD.

*Primary Examiner* — Allen Parker
*Assistant Examiner* — Stephen Bradley
(74) *Attorney, Agent, or Firm* — Treyz Law Group, P.C.; G. Victor Treyz; Joseph F. Guihan

(57) ABSTRACT

An electronic device may include a display. The display may be formed by an array of light-emitting diodes mounted to the surface of a substrate. The light-emitting diodes may be inorganic light-emitting diodes formed from separate crystalline semiconductor structures. An array of pixel control circuits may be used to control light emission from the light-emitting diodes. Each pixel control circuit may be used to supply drive signals to a respective set of the light-emitting diodes. The pixel control circuits may each have a silicon integrated circuit that includes transistors such as emission enable transistors and drive transistors for supplying the drive signals and may each have thin-film semiconducting oxide transistors that are coupled to the integrated circuit and that serve as switching transistors.

14 Claims, 10 Drawing Sheets

(56) References Cited

U.S. PATENT DOCUMENTS

| | | | |
|---|---|---|---|
| 2011/0187435 A1* | 8/2011 | Kamata | G06K 19/0701 |
| | | | 327/306 |
| 2012/0062561 A1* | 3/2012 | Koyama | H04N 13/0497 |
| | | | 345/419 |
| 2012/0223875 A1 | 9/2012 | Lau et al. | |
| 2012/0228669 A1* | 9/2012 | Bower | H01L 27/3255 |
| | | | 257/103 |
| 2012/0306843 A1* | 12/2012 | Wang | G09G 3/3258 |
| | | | 345/212 |
| 2013/0088416 A1* | 4/2013 | Smith | G09G 3/3233 |
| | | | 345/76 |
| 2013/0248829 A1* | 9/2013 | Smith | H01L 51/0031 |
| | | | 257/40 |
| 2013/0321371 A1* | 12/2013 | Koyama | H01L 27/15 |
| | | | 345/209 |
| 2014/0091993 A1 | 4/2014 | Lau et al. | |
| 2014/0291669 A1* | 10/2014 | Ji | H01L 29/66969 |
| | | | 257/43 |

* cited by examiner

HYBRID PIXEL CONTROL CIRCUITS FOR LIGHT-EMITTING DIODE DISPLAY

BACKGROUND

This relates generally to electronic devices and, more particularly, to electronic devices with displays.

Electronic devices often include displays. For example, an electronic device may have a liquid crystal display in which liquid crystal display pixels are used to display images for a user. Liquid crystal displays often include light-emitting diode backlight units for providing backlight illumination. Display efficiency can be adversely affected by inefficiencies in producing backlight illumination and in transmitting backlight illumination through liquid crystal display structures. Liquid crystal display structures also exhibit limited contrast ratios. Organic light-emitting diode displays have been developed that exhibit high contrast ratios, but these devices may consume more power than desired due to the inefficiencies in their organic light-emitting diodes. It can also be challenging to ensure that organic light-emitting diodes exhibit desired lifetimes.

To address some of the shortcomings of liquid crystal displays and organic light-emitting diode displays, displays have been developed that are based on arrays of discrete inorganic light-emitting diodes. In this type of display, driver circuits may be implemented using silicon integrated circuits that are dispersed among the array of light-emitting diodes. Each integrated circuit may control light output from an associated set of nearby light-emitting diodes. Although this type of arrangement may be satisfactory for certain displays, it may be difficult to achieve design goals for some displays such as displays with low power requirements. For example, leakage current limitations may make it difficult or impossible to use this type of circuitry to drive displays that are operating at low refresh rates to conserve power.

It would therefore be desirable to be able to provide improved circuitry for controlling the operation of electronic device displays such as displays based on arrays of light-emitting diodes.

SUMMARY

An electronic device may include a display. The display may be formed by an array of light-emitting diodes mounted to the surface of a display substrate. The light-emitting diodes may be inorganic light-emitting diodes formed from separate crystalline semiconductor structures. An array of pixel control circuits may be used to control light emission from the light-emitting diodes. Each pixel control circuit may be used to supply drive signals to a respective set of the light-emitting diodes. For example, each pixel control circuit may distribute individually controlled drive currents to a set of six respective light-emitting diodes. Each of the light-emitting diodes forms a separate pixel in the display.

The pixel control circuits may each have a silicon integrated circuit. The silicon integrated circuit may be used to implement transistors such as emission enable transistors and drive transistors for supplying the drive signals. Transistors such as these may exhibit low power consumption due to the relatively low drain-to-source voltages that may be achieved when implementing the transistors in a silicon integrated circuit. Each pixel control circuit may also have thin-film transistors formed on the substrate of the display. The thin-film transistors may be used as switching transistors that distribute data signals to the gates of drive transistors in the silicon integrated circuits. Thin-film semiconducting oxide transistors may exhibit low leakage currents and may help support variable refresh rate display control schemes in which power is conserved by selectively reducing refresh rates.

DETAILED DESCRIPTION

Figure 1:
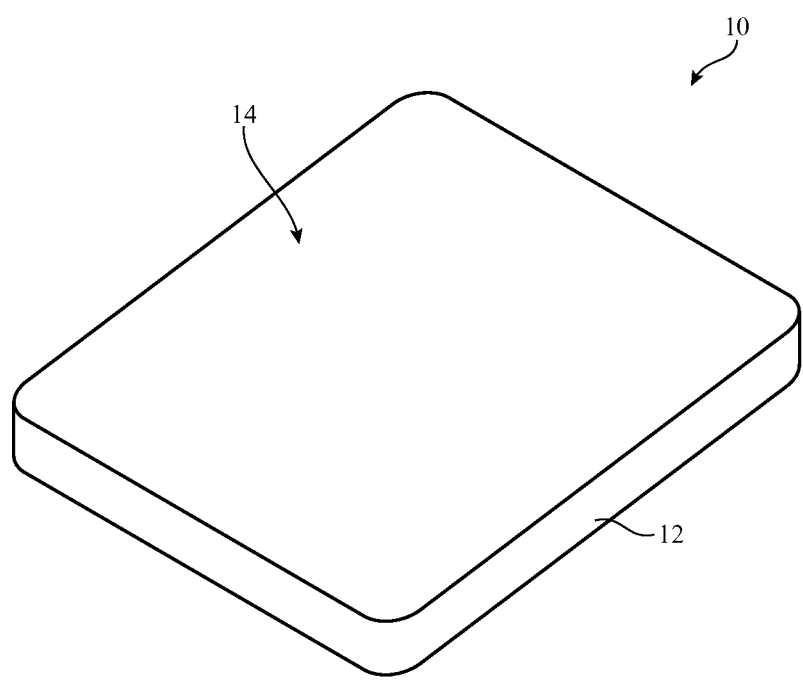
FIG. 1 is a perspective view of an illustrative electronic device having a display in accordance with an embodiment.

An illustrative electronic device of the type that may be provided with a display is shown in FIG. 1. An electronic device such as electronic device 10 of FIG. 1 may be a computing device such as a laptop computer, a computer monitor containing an embedded computer, a tablet computer, a cellular telephone, a media player, or other handheld or portable electronic device, a smaller device such as a wrist-watch device, a pendant device, a headphone or earpiece device, or other wearable or miniature device, a television or other display for video, a computer display that does not contain an embedded computer, a gaming device, a navigation device, an embedded system such as a system in which electronic equipment with a display is mounted in a kiosk or automobile, equipment that implements the functionality of two or more of these devices, or other electronic equipment. The configuration of device 10 that is shown in FIG. 1 (e.g., a portable device configuration in which device 10 is a cellular telephone, media player, wrist device, tablet computer, or other portable computing device) is shown as an example. Other configurations may be used for device 10 if desired.

Device 10 may have one or more displays such as display 14 mounted in housing structures such as housing 12. Housing 12 of device 10, which is sometimes referred to as a case, may be formed of materials such as plastic, glass, ceramics, carbon-fiber composites and other fiber-based composites, metal (e.g., machined aluminum, stainless steel, or other metals), other materials, or a combination of these materials. Device 10 may be formed using a unibody construction in which most or all of housing 12 is formed from a single structural element (e.g., a piece of machined metal or a piece of molded plastic) or may be formed from multiple housing structures (e.g., outer housing structures that have been mounted to internal frame elements or other internal housing structures).

Display 14 may be a touch sensitive display that includes a touch sensor or may be insensitive to touch. Touch sensors for display 14 may be formed from an array of capacitive touch sensor electrodes, a resistive touch array, touch sensor structures based on acoustic touch, optical touch, or force-based touch technologies, or other suitable touch sensor components. Touch sensor electrodes may be used to capture touch input from a user's finger or a stylus and/or may be used to gather fingerprint data.

Display 14 may include an array of pixels that emit light such as an array of light-emitting diode pixels. In general, display 14 may use liquid crystal display technology, light-emitting diode display technology such as organic light-emitting diode display technology, plasma display technology, electrophoretic display technology, electrowetting display technology, or other types of display technology. Configurations in which display 14 is based on an array of light-emitting diodes are sometimes described herein as an example. This is, however, merely illustrative. Other types of display technology may be incorporated into device 10 if desired.

Figure 2:
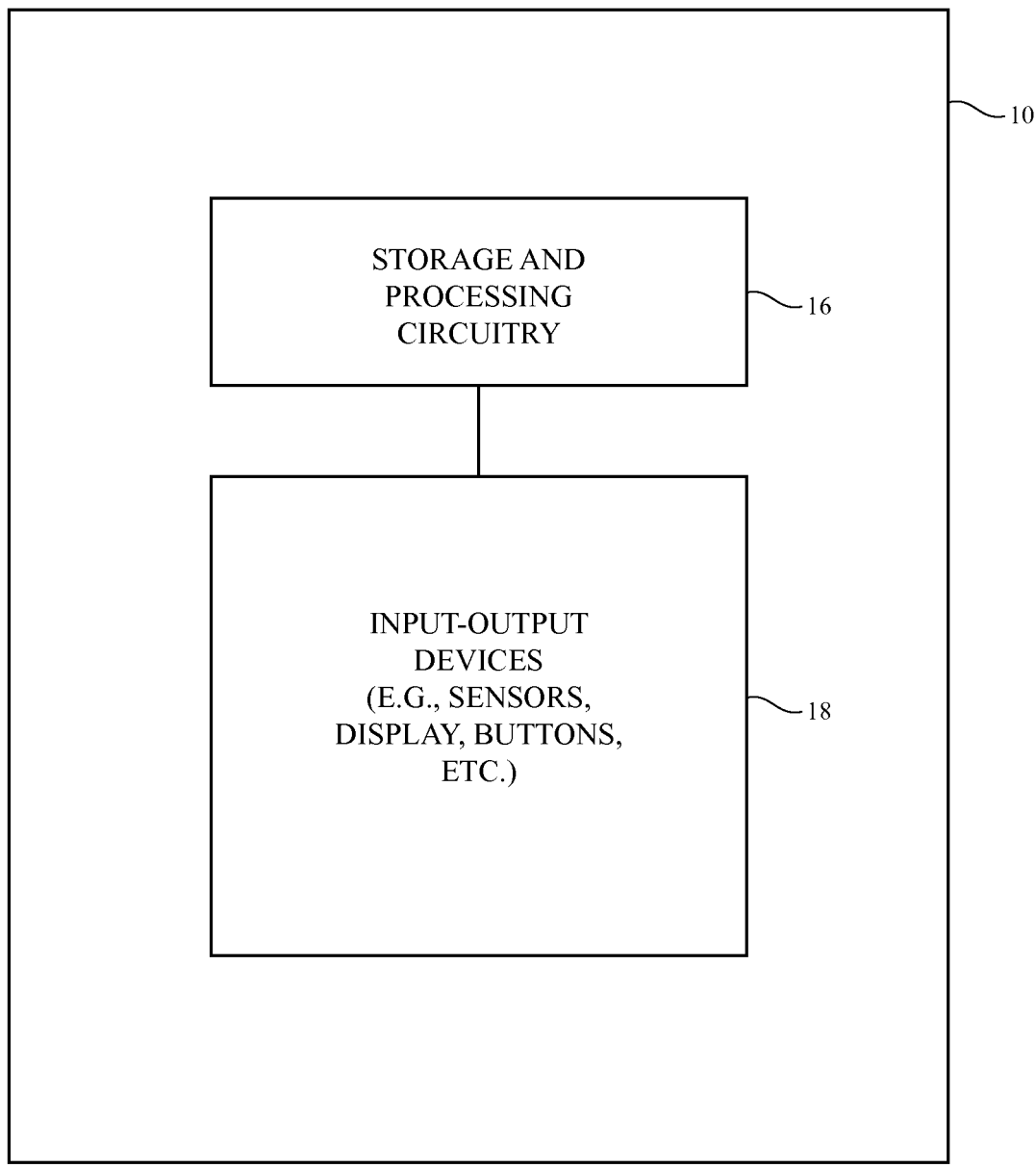
FIG. 2 is a schematic diagram of an illustrative electronic device having a display in accordance with an embodiment.

A schematic diagram of an electronic device such as electronic device 10 of FIG. 1 is shown in FIG. 2. As shown in FIG. 2, electronic device 10 may have control circuitry 16. Control circuitry 16 may include storage and processing circuitry for supporting the operation of device 10. The storage and processing circuitry may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in control circuitry 16 may be used to control the operation of device 10. The processing circuitry may be based on one or more microprocessors, microcontrollers, digital signal processors, baseband processors, power management units, audio codec chips, application specific integrated circuits, etc.

Input-output circuitry in device 10 such as input-output devices 18 may be used to allow data to be supplied to device 10 and to allow data to be provided from device 10 to external devices. Input-output devices 18 may include buttons, joysticks, scrolling wheels, touch pads, fingerprint sensors, key pads, keyboards, microphones, speakers, tone generators, vibrators, cameras, sensors, light-emitting diodes and other status indicators, data ports, etc. A user can control the operation of device 10 by supplying commands through input-output devices 18 and may receive status information and other output from device 10 using the output resources of input-output devices 18. Input-output devices 18 may include one or more displays such as display 14 of FIG. 1.

Control circuitry 16 may be used to run software on device 10 such as operating system code and applications. During operation of device 10, the software running on control circuitry 16 may display images on display 14 in input-output devices 18.

Figure 3:
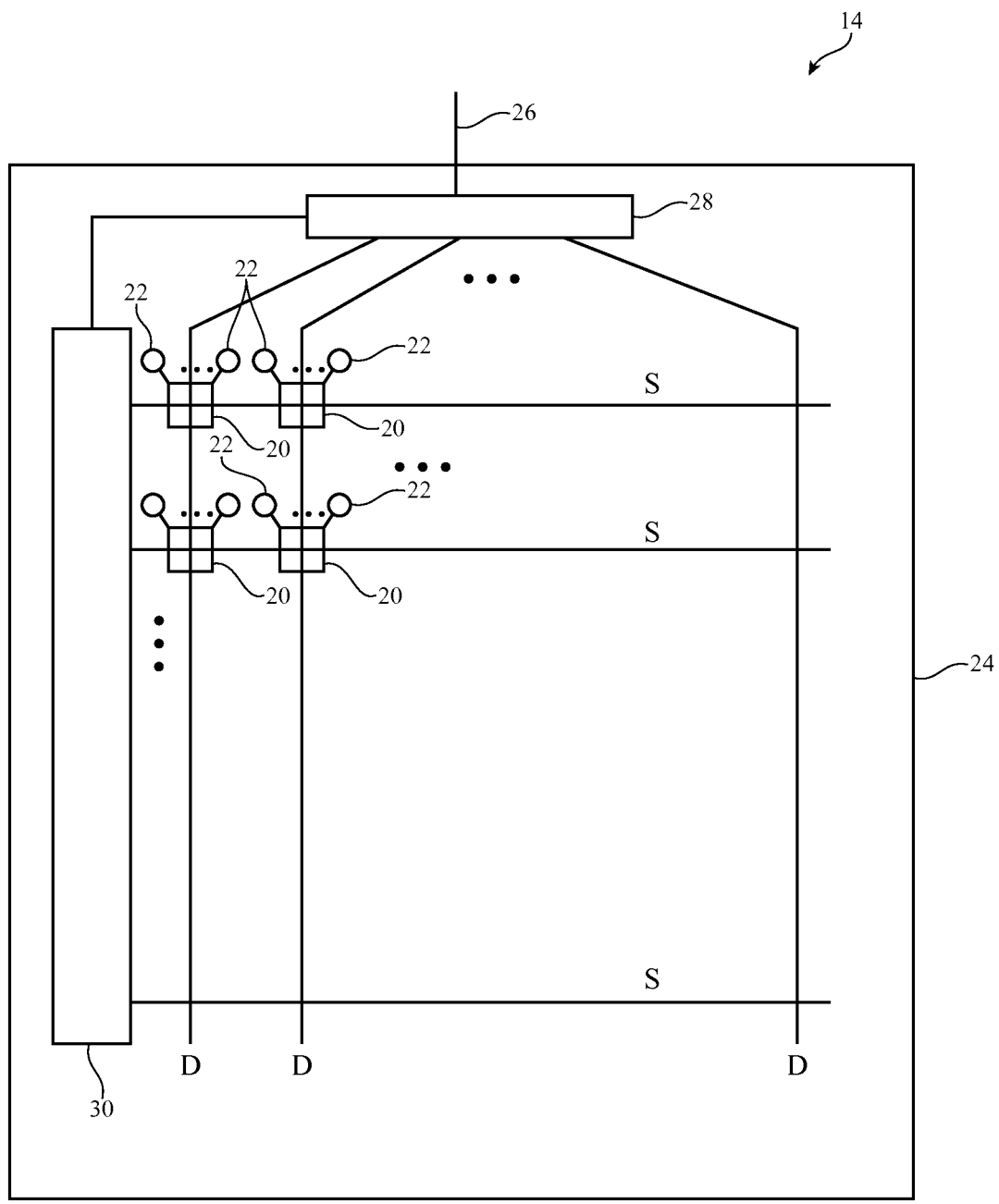
FIG. 3 is a diagram of an illustrative display in accordance with an embodiment.

As shown in the illustrative diagram of FIG. 3, display 14 may include layers such as substrate layer 24. Layers such as substrate 24 may be formed from layers of material such as glass layers, polymer layers, composite films that include polymer and inorganic materials, metallic foils, semiconductors such as silicon or other semiconductor materials, layers of material such as sapphire (e.g., crystalline transparent layers, ceramics, etc.), or other material. Substrate 24 may be planar or may have other shapes (e.g., concave shapes, convex shapes, shapes with planar and curved surface regions, etc.). The outline of substrate 24 may be circular, oval, rectangular, square, may have a combination of straight and curved edges, or may have other suitable shapes. As shown in the rectangular substrate example of FIG. 3, substrate 24 may have left and right vertical edges and upper and lower horizontal edges.

Display 14 may have an array of pixels 22 for displaying images for a user. Sets of one or more pixels 22 may be controlled using respective pixel control circuits 20. Pixel control circuits 20 may be formed using integrated circuits (e.g., silicon integrated circuits) and/or thin-film transistor circuitry on substrate 24. The thin-film transistor circuitry may include thin-film transistors formed from silicon (e.g., polysilicon thin-film transistors or amorphous silicon transistors) and/or may include thin-film transistors based on semiconducting oxides (e.g., indium gallium zinc oxide transistors or other semiconducting oxide thin-film transistors). Semiconducting oxide transistors such as indium gallium zinc oxide transistors may exhibit low leakage currents and may therefore be advantageous in configurations for display 14 where it is desirable to lower power consumption (e.g., by lowering the refresh rate for the pixels of the display). Configurations for display 14 in which pixel control circuits 20 are each formed from a silicon integrated circuit and a set of thin-film semiconducting oxide transistors are sometimes described herein as an example.

Pixels 22 may be organized in an array (e.g., an array having rows and columns). Pixel control circuits 20 may be organized in an associated array (e.g., an array having rows and columns). As shown in FIG. 3, pixel control circuits 20 may be interspersed among the array of pixels 22. Pixels 22 and pixel control circuits 20 may be organized in arrays with rectangular outlines or may have outlines of other suitable shapes. There may be any suitable number of rows and columns in each array (e.g., ten or more, one hundred or more, or one thousand or more).

Each pixel 22 may be formed from a light-emitting component such as a light-emitting diode. If desired, each pixel may contain a pair of light-emitting diodes or other suitable number of light-emitting diodes for redundancy. In this type of configuration, the pair of light-emitting diodes in each pixel can be driven in parallel (as an example). In the event that one of the light-emitting diodes fails, the other light-emitting diode will still produce light.

Display driver circuitry such as display driver circuitry 28 may be coupled to conductive paths such as metal traces on substrate 24 using solder or conductive adhesive. Display driver circuitry 28 may contain communications circuitry for communicating with system control circuitry over path 26. Path 26 may be formed from traces on a flexible printed circuit or other cable or may be formed using other signal path structures in device 10. The control circuitry may be located on a main logic board in an electronic device in which display 14 is being used. During operation, the control circuitry on the logic board (e.g., control circuitry 16 of FIG. 1) may supply circuitry such as display driver circuitry 28 with information on images to be displayed on display 14. To display the images on display pixels 22, display driver circuitry 28 may supply corresponding image data to data lines D (sometimes referred to as source lines) while issuing control signals to supporting display control circuitry such as scan line driver circuitry 30 or other control circuitry.

Circuitry 30 may generates corresponding horizontal control signals on horizontal control lines S. Horizontal control lines S may sometimes be referred to as scan lines, gate lines, or control lines and may carry analog and/or digital control signals (e.g., scan signals, emission transistor control signals, clock signals, digital control data, etc.). There may be one or more horizontal control lines associated with each row of pixel control circuits 20 and one or more data lines associated with each column of pixel control circuits 30. Circuitry 30 may be formed on the left and right edges of display 14, on only a single edge of display 14, or elsewhere in display 14.

Display control circuitry such as circuitry 28 and 30 may be implemented using one or more integrated circuits (e.g., display driver integrated circuits such as timing controller integrated circuits and associated source driver circuits and/or gate driver circuits) or may be implemented using thin-film transistor circuitry implemented on substrate 24.

With the illustrative arrangement of FIG. 3, data lines D run vertically through display 14. Each column of pixel control circuits 20 may be associated with a respective group of data lines D. Pixels 22 may include light-emitting diodes of different colors (e.g., red, green, blue). Corresponding data lines D may be used to carry red, green, and blue data. Pixel arrangements of other colors may be used, if desired (e.g., four color arrangements, arrangements that include white pixels, three-pixel configurations with pixels other than red, green, and blue pixels, etc.). To produce different colors, the light-emitting diodes of pixels 22 may be constructed from different materials systems (e.g., AlGaAs for red diodes, GaN multiple quantum well diodes with different quantum well configurations for green and blue diodes, respectively), may be formed using different phosphorescent materials or different quantum dot materials to produce red, blue, and/or green luminescence, or may be formed using other techniques or combinations of these techniques). The light-emitting diodes of pixels 22 may radiate upwards (i.e., pixels 22 may use a top emission design) or may radiate downwards through substrate 24 (i.e., pixels 22 may use a bottom emission design). The light-emitting diodes may have thicknesses of about 0.5 to 10 microns and may have lateral dimensions of about 2 microns to 100 microns (as examples). Light-emitting diodes with other thicknesses (e.g., below 2 microns, above 2 microns, etc.) and that have other lateral dimensions (e.g., below 10 microns, below 20 microns, above 3 microns, above 15 microns, etc.) may also be used, if desired.

Horizontal control lines S run horizontally through display 14. If desired, there may be multiple horizontal lines S associated with each row of pixel circuits 20. Horizontal control lines in display 14 may carry scan line signals for controlling switching transistors, emission transistor control signals for controlling emission enable transistors, and/or other control signals for pixel circuits 20. If desired, digital control signals can be provided to circuits 20, which may then produce corresponding analog light-emitting drive signals based on the digital control signals. Configurations with scan line signals are sometimes described herein as an example.

With one suitable scan line arrangement, circuitry 30 may assert scan line signals on lines S in display 14 in sequence starting with a signal line S in the first row of display pixels 22 and continuing through successive rows and lines S until finished. In this way, circuitry 28 and 30 may provide pixel circuits 20 with signals that direct pixel circuits 20 to use light-emitting diodes in pixels 22 to generate light for displaying a desired image on display 14. If desired, more complex patterns of control signals may be supplied to pixel circuits 20 to implement threshold voltage compensation schemes for the transistors of the pixel control circuitry or other pixel control functions (e.g., control signals including one, two, or more than two scan line signals, control signals including emission transistor control signals, and/or other pixel control circuit control signals).

Figure 4:
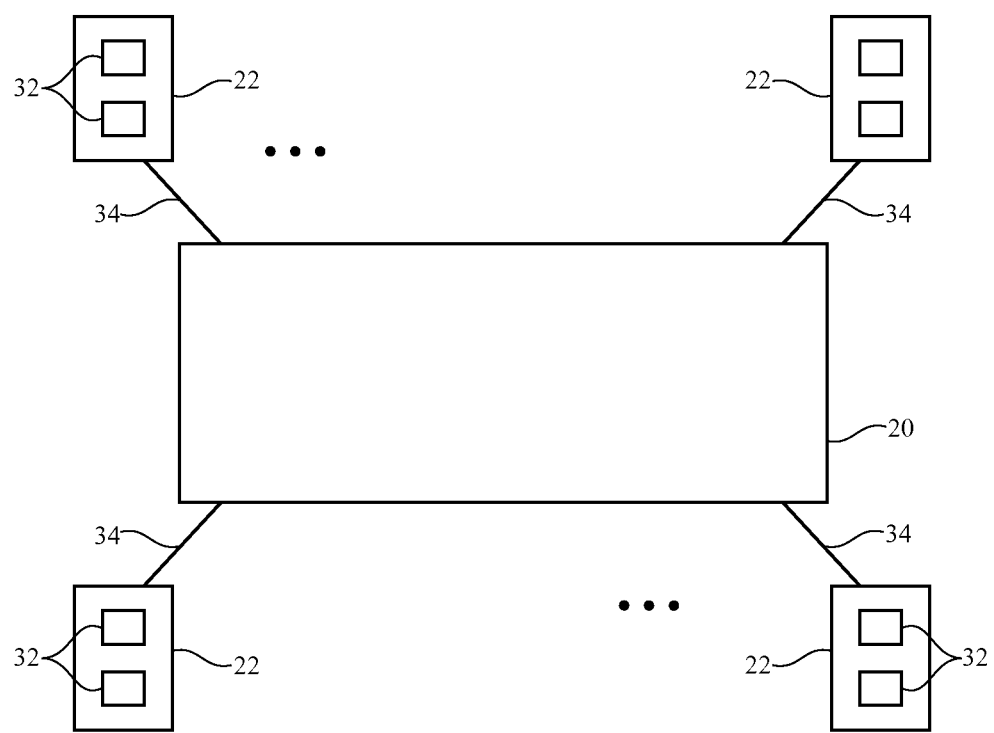
FIG. 4 is a diagram of a illustrative pixel control circuit and an associated set of light-emitting diode pixels that are being controlled by the pixel control circuit in accordance with an embodiment.

During operation of display 14, each pixel control circuit 20 may supply output signals to a corresponding set of pixels 22 based on the control signals received by that pixel control circuit. As shown in FIG. 4, for example, pixel control circuit 20 may be coupled to multiple pixels 22 using output lines 34. Lines 34 may be formed from conductive traces on substrate 24 and may carry drive current for controlling light output from the light-emitting diode structures of a corresponding pixel 22. Lines 34 may form anode terminals for light-emitting diodes 32. Any suitable number of light-emitting diodes 32 may be associated with each pixel 22. For example, each pixel 22 may include a single light-emitting diode or may, for redundancy, include a pair of light-emitting diodes 32 that are driven in parallel. There may be one or more, two or more, three or more, four or more, five or more, ten or more, 2 to 10, 3 to 12, 6 to 12, between 4 and 25, fewer than 100, more than 50, or other suitable number of pixels 22 that are controlled by a given pixel control circuit 20 using a corresponding set of output lines 34.

Figure 5:
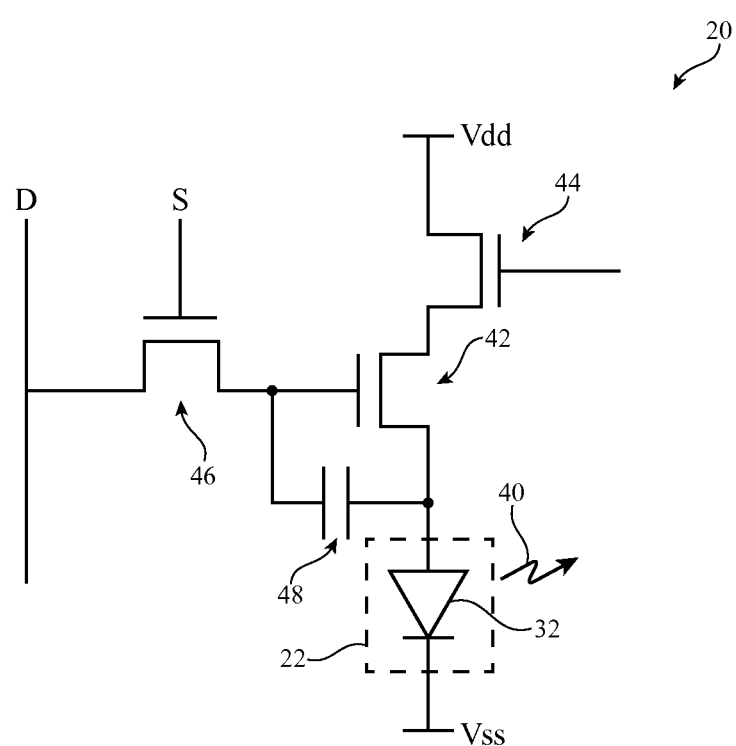
FIG. 5 is a circuit diagram of illustrative pixel control circuitry for controlling light emission from a light-emitting diode in accordance with an embodiment.

Illustrative circuitry of the type that may be incorporated into pixel control circuitry 20 is shown in FIG. 5. The example of FIG. 5 shows circuitry that may be used in controlling the drive current for one or more light-emitting diodes 32 in a single pixel 22. Additional circuitry is of the type shown in FIG. 5 is incorporated into pixel control circuit 20 when it is desired to handle more pixels. For example, a pixel control circuit that is configured to provide drive currents for six pixels 22, may include six circuits of the type shown in FIG. 5, each providing a respective output drive current to one of the pixels.

Pixel control circuitry 20 of FIG. 5 may receive a positive power supply voltage Vdd at a positive power supply terminal and may receive a ground power supply voltage Vss at a ground power supply terminal. Data signals may be received over a data line D. Control signals such as scan line signals may be received on scan line S.

Scan line S may be coupled to the gate of transistor 46. Pixel control transistors such as transistor 46 are sometimes referred to as switching transistors or data loading transistors. Switching transistor 46 is used to load ("switch") a data line voltage from data line D onto the gate of drive transistor 42. Capacitor 48 can help maintain a desired value for this voltage between successive image frames. The voltage on the gate of drive transistor 42 establishes a drive current value for a light-emitting diode drive current being applied to light-emitting diode 32. The magnitude of the drive current controls the magnitude of emitted light 40 from diode 32.

Some pixel circuits such as the illustrative pixel control circuit of FIG. 5 may include emission transistors such as emission transistor 44. Emission transistor 44 may be coupled in series with drive transistor 42. Emission transistors such as transistor 44 may sometimes be referred to as emission enable transistors because light emission is enabled when the emission transistors are turned on. In the configuration of FIG. 5, for example, drive transistor 42 can be adjusted to produce a desired amount of drive current through light-emitting diode 32 and thereby emit a desired amount of light 40 only when emission transistor 44 has been turned on. When emission transistor 44 is off, other pixel control circuit operations can be performed (e.g., data loading, threshold voltage compensation to eliminate the dependence of the light-emitting drive current on the threshold voltage of drive transistor 42, etc.). In a pixel control circuit with emission enable transistors, there may be one or more emission enable transistors coupled in series with drive transistor 42 and light-emitting diode 32. The configuration of FIG. 5 uses a single emission transistor.

Power efficiency can be adversely affected by large drain-source voltage drops (Vds values) across the source-drain terminals of transistors such as transistors 42 and 44 of FIG. 5. Accordingly, transistors such as drive transistor 42 and emission transistor 44 may sometimes be referred to as Vds-sensitive transistors (drain-to-source-voltage-sensitive transistors).

Excessive leakage current is a concern for switching transistors such as switching transistor 46, because excessive leakage current will prematurely drain charge from capacitor 48 and will therefore limit the lowest possible refresh rate that can be used for display 14 while sustaining the charge of capacitor 48 at a desired level. By ensuring that the leakage current from transistor 46 is small, a variable refresh rate scheme can be implemented for display 14 in which power consumption is minimized by reducing the refresh rate for display 14 when the content be displayed allows the refresh rate to be reduced. Because satisfactory operation of circuitry 20 in this type of situation benefits from reduction in the leakage current of switching transistors such as transistor 46, transistors such as transistor 46 may sometimes be referred to as leakage-current-sensitive transistors.

Figure 6:
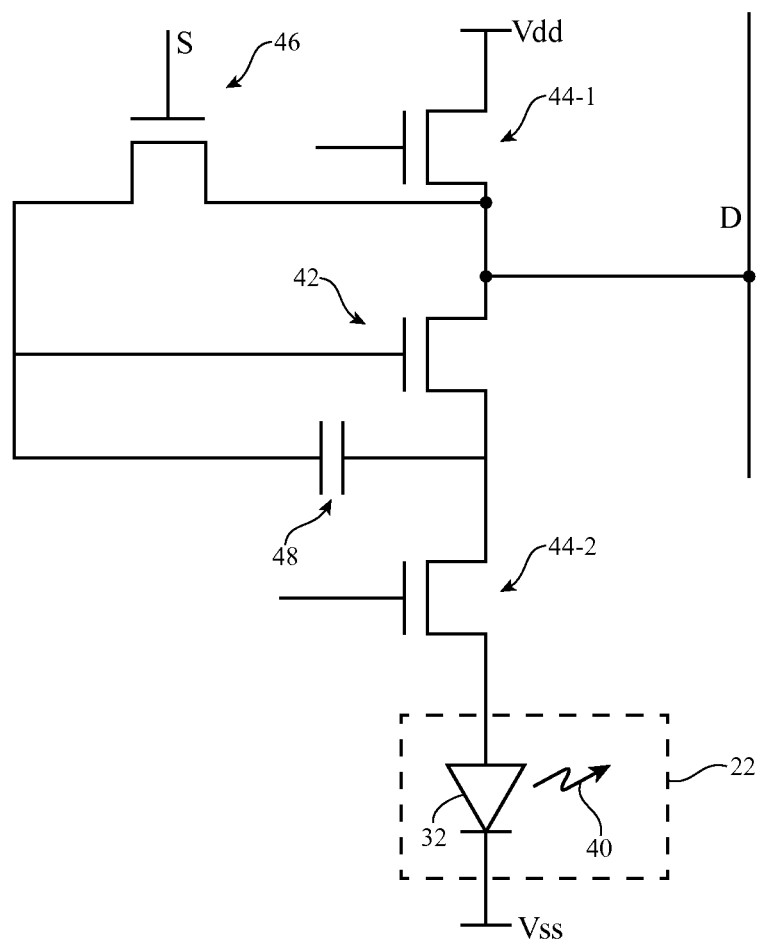
FIG. 6 is a circuit diagram of additional illustrative pixel circuitry for controlling light emission from a light-emitting diode in accordance with an embodiment.

FIG. 6 is a circuit diagram of another illustrative pixel control circuit of the type that may contain leakage sensitive transistors and Vds-sensitive transistors. In the example of FIG. 6, pixel control circuitry 20 includes leakage-current-sensitive transistor 46 (e.g., a switching transistor controlled by scan line signals on scan line S) and Vds-sensitive transistors such as drive transistor 42 and emission transistors 44-1 and 44-2.

To balance a desire for low Vds values for some transistors with a desire for low leakage current for other transistors, pixel control circuits 20 may be implemented using a hybrid design that includes multiple different types of transistor. Example of transistor types that may be used in implementing the transistors of pixel control circuits 20 include silicon thin-film transistors (e.g., polysilicon thin-film transistors and/or amorphous silicon thin-film transistors), semiconducting oxide thin-film transistors (e.g., transistors having channel regions formed from semiconducting oxides such as indium gallium zinc oxide), and silicon transistors (e.g., transistors formed as part of an integrated circuit based on a crystalline silicon die).

With one suitable arrangement, which is sometimes described herein as an example, Vds-sensitive transistors such as drive transistors and emission transistors can be formed from a silicon integrated circuit (i.e., a silicon integrated circuit containing silicon transistors with low Vds values), whereas leakage-sensitive-transistors can be formed from semiconducting oxide transistors (i.e., oxide transistors such as indium gallium zinc oxide or other semiconducting oxide materials that exhibit low leakage currents). The silicon integrated circuit die that is used in implementing the silicon transistors may be mounted to a glass or plastic substrate on which the semiconducting oxide transistors have been formed.

Figure 7:
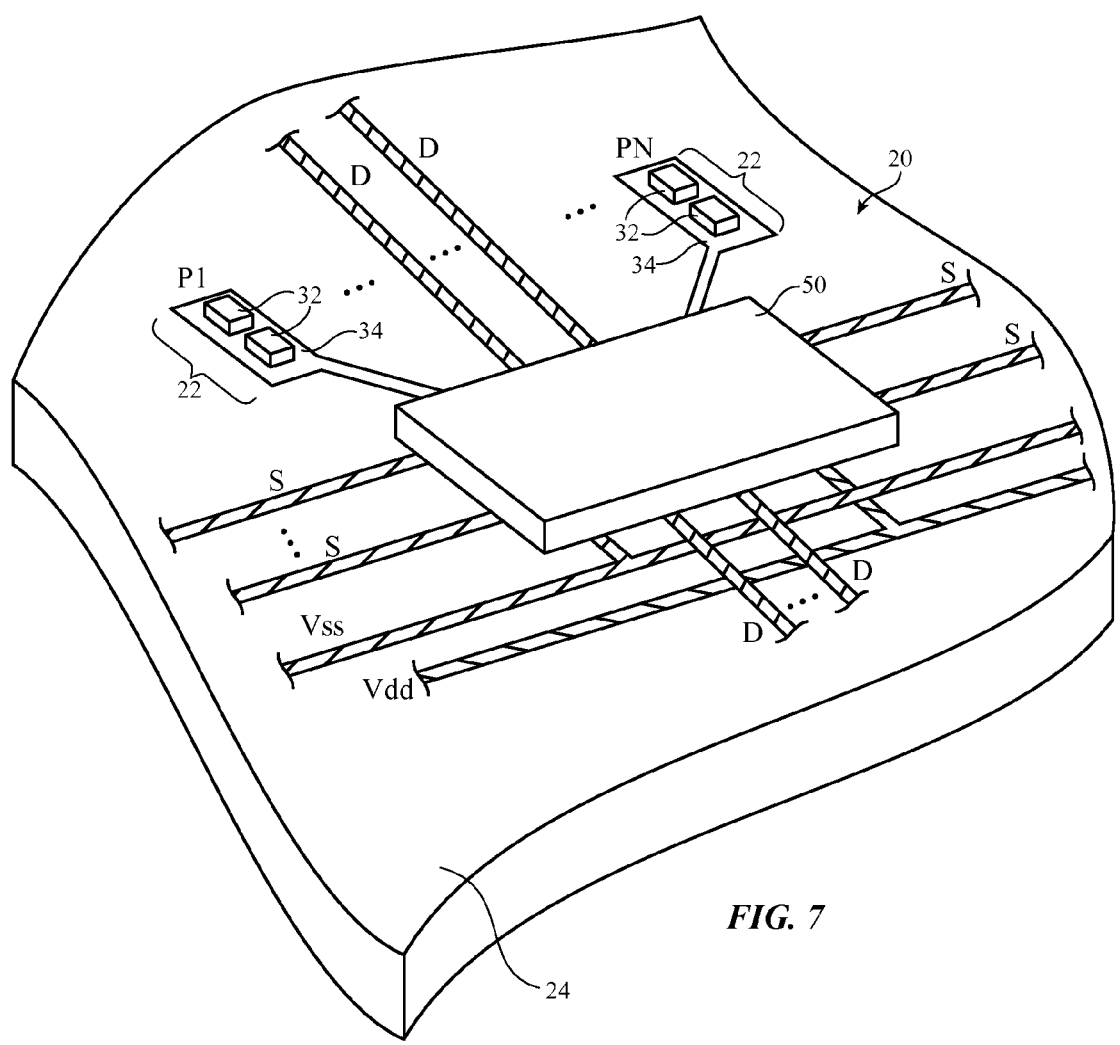
FIG. 7 is a perspective view of an illustrative integrated circuit mounted to a display substrate to form part of a pixel control circuit that controls light-emitting diodes for a set of pixels in accordance with an embodiment.

Consider, as an example, pixel control circuit 20 of FIG. 7. In the example of FIG. 7, silicon integrated circuit 50 has been mounted on substrate 24. Integrated circuit 50 contains silicon transistors (e.g., bipolar transistors, metal-oxide-semiconductor transistors, etc.). The silicon transistors of integrated circuit 50 and semiconducting oxide transistors formed on substrate 24 may be used in forming pixel control circuit 20. In the example of FIG. 7, there are N pixels 22 (P1 . . . PN) being controlled by pixel control circuitry 20. The value of N may be more than 2, more than 5, more than 10, more than 20, between 2 and 30, between 4 and 25, less than 100, less than 15, or other suitable number.

As shown in FIG. 7, conductive lines such as data lines D, scan lines S, ground power supply path Vss, and positive power supply path Vdd may be formed on the upper surface of substrate 24. Substrate 24 may be formed from a transparent material or an opaque material (e.g., glass, plastic, silicon or other semiconductors, ceramic, sapphire or other crystalline substrates, or other materials). Lines such as data lines D, scan lines S, and other control lines, power supply lines such as Vss and Vdd power lines, and diode output paths (e.g., anode terminals) 34 may be formed from conductive traces on the surface of substrate 24 (e.g., one or more metal layers in a stack separated by one or more intervening oxide layers or other insulating layers).

Semiconducting oxide transistors may be formed on the surface of substrate 24 and may be interconnected with the metal traces on the surface of substrate 24. Semiconducting oxide transistors may be formed in portions of substrate 24 that are not overlapped by integrated circuits 50 or may be formed in the portions of substrate 24 that are covered with integrated circuits 50 (e.g., to conserve use of surface area by circuitry 20). One or more light-emitting diodes 32 may be mounted on each anode terminal and output line 34. Cathode terminals for diodes 32 may be formed using blanket conductive layers and/or patterned conductive lines (e.g., metal traces, etc.). Light 40 from diodes 32 may be emitted upwards (i.e., display 14 may be a top emission display) or may be emitted downwards (e.g., through substrate 24 in a bottom emission display).

Figure 8:
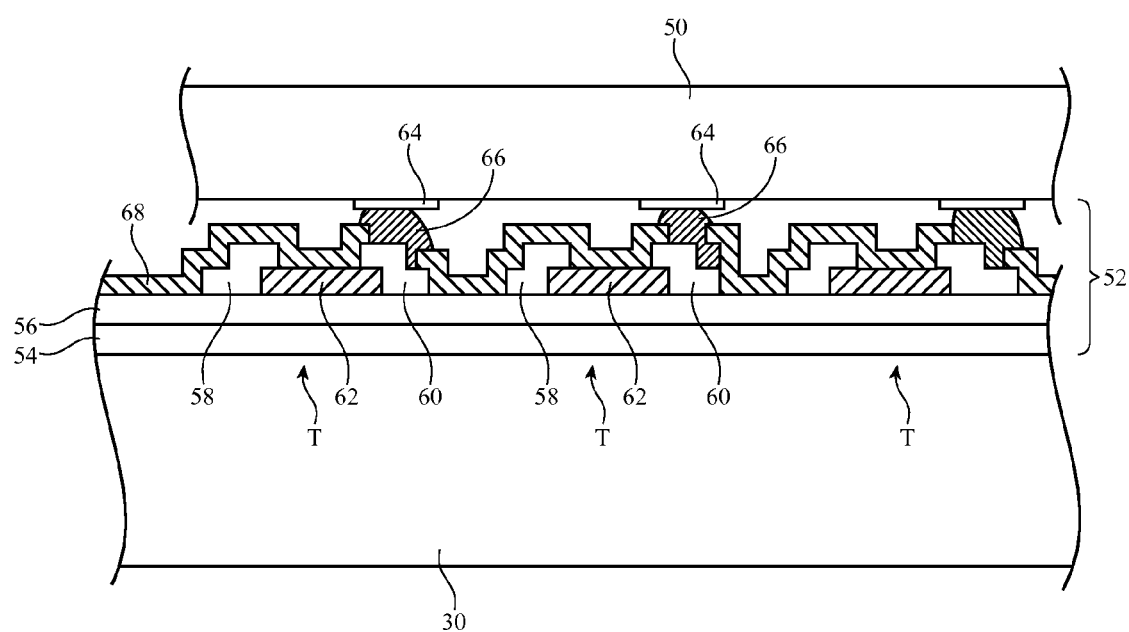
FIG. 8 is a cross-sectional side view of an illustrative integrated circuit that is mounted to a display substrate in a location that overlaps thin-film transistors such as thin-film oxide transistors on the display substrate in accordance with an embodiment.

FIG. 8 is a cross-sectional side view of an illustrative integrated circuit such as integrated circuit 50 of FIG. 7 mounted to the surface of substrate 24 in a location that overlaps semiconducting oxide thin-film transistors 52. Thin-film transistor circuitry 52 may be semiconductor oxide thin-film transistor circuitry. There are three semiconducting oxide transistors T in the example of FIG. 8. This is merely illustrative. Any suitable number of semiconducting oxide transistors in circuitry 52 may be formed under integrated circuit 50. Transistors T may serve as leakage-current-sensitive transistors such as switching transistors 46 of FIGS. 5 and 6 or other transistors in pixel control circuit 20.

Circuitry 52 may include metal traces formed from metal layers such as first metal layer (M1 Layer) 54. Layer 54 may be patterned to form gate conductors (gate terminals) for transistors T (i.e., transistor circuitry 52 may use a bottom gate design). If desired, a top gate design may be used for transistors T.

As shown in FIG. 8, gate insulator layer 56 may cover gate conductor layer 54. Gate insulator layer 56 may be formed from a dielectric such as an oxide (e.g., silicon oxide) and/or other dielectric materials (silicon nitride, other inorganic materials, etc.). A second metal layer (e.g., an "M2" layer) may be patterned to form source contacts and drain contacts (collectively source-drain contacts 58 and 60) for semiconducting oxide thin-film transistors T. Each semiconducting oxide transistor has a channel region formed from a layer of semiconducting oxide 62. In the example of FIG. 8, source-drain terminals 58 and 60 have been patterned to cover the edges of respective semiconductor oxide layers 62. If desired, an intervening dielectric layer (e.g., an oxide layer or other suitable layer) may be patterned to form openings through which source-drain terminals 58 and 60 contact semiconducting oxide 62. The example of FIG. 8 is merely illustrative.

Passivation layer 68 may cover the surface of thin-film transistor circuitry 52. Passivation layer 68 may be formed from an organic or inorganic dielectric layer and may have openings to receive conductive material 66. The openings in passivation layer 68 may be aligned with transistor structures such as source-drain contacts 60 and other conductive structures (e.g., signal lines, other metal traces, etc.) in thin-film semiconducting oxide transistor circuitry 52. Conductive material 66 (e.g., conductive adhesive or solder) may electrically connect the circuitry of integrated circuit 50 to the circuitry of thin-film transistor layer 52. As shown in FIG. 8, for example, integrated circuit 50 may have contacts such as solder pads 64. Solder or other conductive material 66 may be used to connect metal integrated circuit contacts 64 on the lower surface of integrated circuit 50 to source-drain contacts 60 and other metal traces in thin-film transistor circuitry 52.

Figure 9:
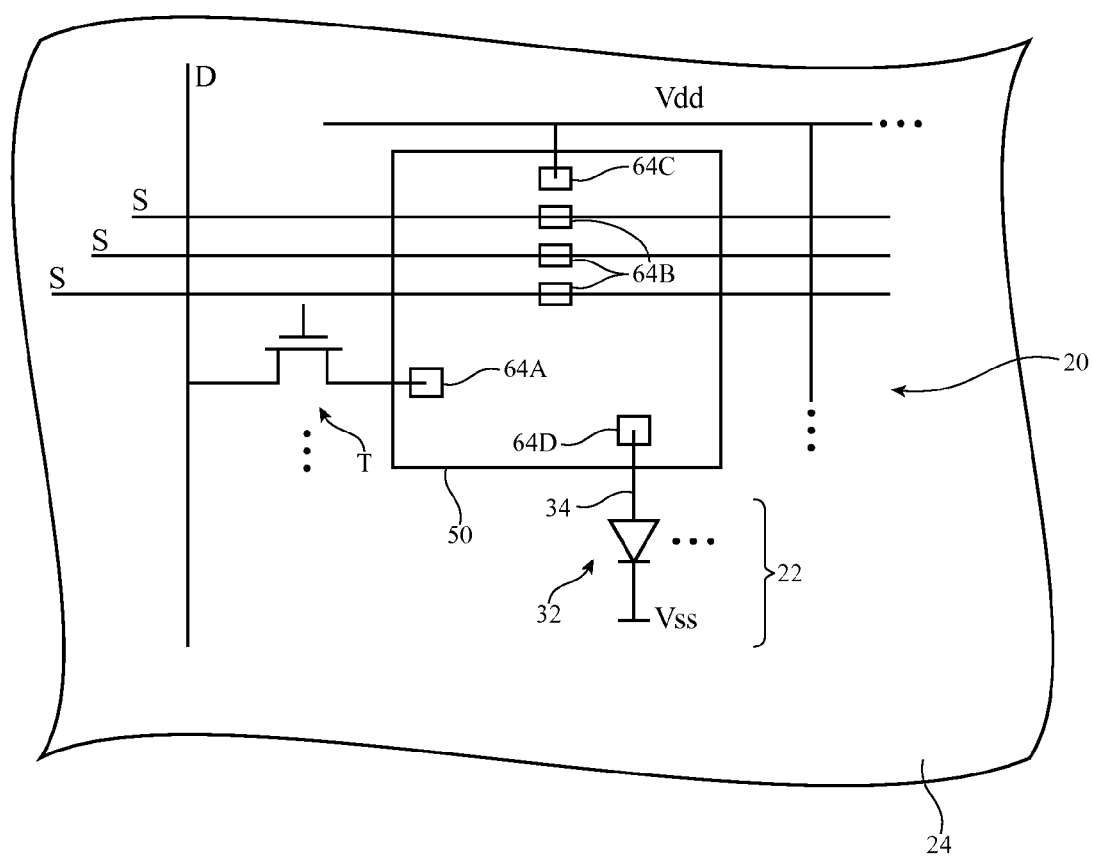
FIG. 9 is a diagram of illustrative pixel control circuitry that includes thin-film transistor circuitry and an integrated circuit in accordance with an embodiment.

The diagram of FIG. 9 shows how semiconductor oxide transistors T (e.g., switching transistors 46) may be coupled to contacts such as pads 64A on integrated circuit 50. Control lines such a scan lines S, emission control lines, and other control lines may be coupled to pads 64B. Pad 64C may be coupled to positive power supply trace Vdd. Output path 34 may couple pad 64D to the anode of light-emitting diode 32.

Figure 10:
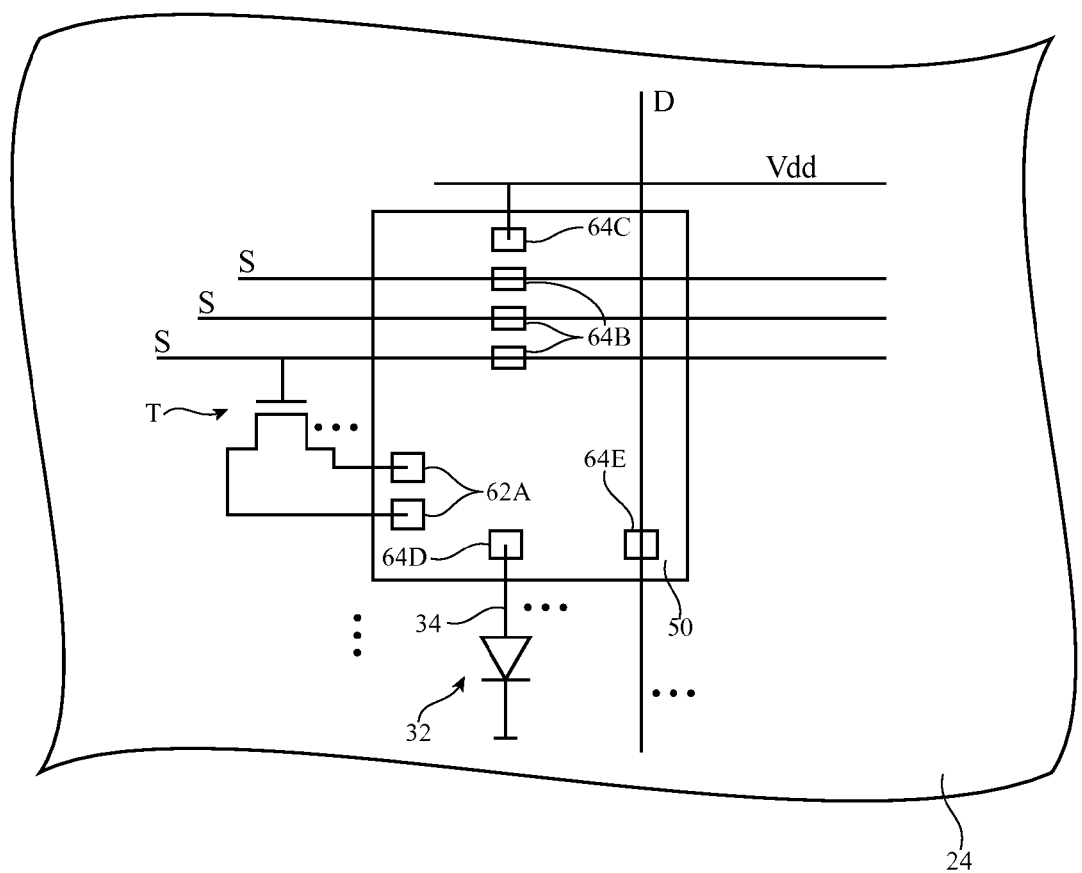
FIG. 10 is a diagram of additional illustrative pixel control circuitry that includes thin-film transistor circuitry and an integrated circuit.

The diagram of FIG. 10 shows how contact pads 62A may be coupled to both terminals of each transistor T (e.g., each switching transistor 46). Contacts 64B may be coupled to scan lines or other control signals, contacts such as contact 64C may be coupled to power supply lines such as line Vdd, and contacts such as pad 64D may be coupled to anodes (output paths) 34. Contacts such as contact 64E may be connected to data lines D.

The examples of FIGS. 9 and 10 are merely illustrative. In general, the metal traces on substrate 24 may be coupled to one or more contacts 64 on integrated circuit 50 so that signals can be routed between the interconnects and other circuitry on substrate 24 (e.g., thin-film circuitry such as semiconductor oxide thin-film transistor circuitry 52) and the silicon transistors and other circuitry of silicon integrated circuit 50 and so that signals can be routed from circuit 50 to the thin-film circuitry of substrate 24. The metal traces may form source-drain terminals and gate terminals for transistors (e.g., semiconductor oxide transistors T), may form signal lines for carrying pixel control signals (e.g., scan line signals, emission transistor control signals, and other control signals), may form power lines for carrying ground power or a positive power supply voltage, may serve as anodes 34 for light-emitting diodes 32, may form signal paths such as data lines D, or may form other signal paths.

The foregoing is merely illustrative and various modifications can be made by those skilled in the art without departing from the scope and spirit of the described embodiments. The foregoing embodiments may be implemented individually or in any combination.

What is claimed is:

1. A display, comprising:
    a display substrate;
    light-emitting diodes on the substrate;
    an array of pixel control circuits that control the light-emitting diodes, wherein each pixel control circuit includes a silicon integrated circuit and semiconducting oxide thin-film transistor circuitry, wherein the semiconducting oxide thin-film transistor circuitry is interposed between the silicon integrated circuit and the display substrate, wherein the silicon integrated circuit comprises transistors formed from silicon, and wherein each silicon integrated circuit overlaps at least one semiconducting oxide thin-film transistor in the semiconductor oxide thin-film transistor circuitry; and
    conductive material that connects contacts on the silicon integrated circuit to metal traces on the display substrate, wherein the metal traces comprises source-drain terminals in the semiconducting oxide thin-film transistor circuitry.

2. The display defined in claim 1 wherein each pixel control circuit is coupled to a plurality of light-emitting diodes by a respective set of output paths.

3. The display defined in claim 2 wherein each silicon integrated circuit has at least four outputs each of which is coupled to the anode of at least one of the light-emitting diodes.

4. The display defined in claim 1 wherein the light-emitting diodes include red light-emitting diodes, green light-emitting diodes, and blue light-emitting diodes.

5. The display defined in claim 1 wherein the light-emitting diodes comprise inorganic light-emitting diodes each formed from a respective crystalline semiconductor structure.

6. The display defined in claim 1 wherein each silicon integrated circuit is coupled to between 4 and 25 of the light-emitting diodes.

7. The display defined in claim 6 further comprising a plurality of data lines associated with respective columns of the silicon integrated circuits and a plurality of horizontal control lines associated with respective rows of the silicon integrated circuits.

8. The display defined in claim 1 wherein the pixel control circuits include switching transistors that are formed from semiconducting oxide transistors in the thin-film semiconducting oxide transistor circuitry.

9. The display defined in claim 8 wherein the pixel control circuits include drive transistors that drive current through the light-emitting diodes and wherein the drive transistors are formed in the silicon integrated circuits.

10. The display defined in claim 9 wherein the pixel control circuits include emission enable transistors that are formed in the silicon integrated circuits.

11. A display, comprising:
    a display substrate;
    light-emitting diodes on the substrate;
    an array of pixel control circuits that control the light-emitting diodes, wherein each pixel control circuit includes a silicon integrated circuit and semiconducting oxide thin-film transistor circuitry, wherein the semiconducting oxide thin-film transistor circuitry is interposed between the silicon integrated circuit and the display substrate, wherein the silicon integrated circuit comprises transistors formed from silicon, and wherein each silicon integrated circuit overlaps at least one semiconducting oxide thin-film transistor in the semiconductor oxide thin-film transistor circuitry; and conductive material that connects contacts on the silicon integrated circuit to metal traces on the display substrate, wherein the contacts on the silicon integrated circuit include first and second contacts and wherein the semiconducting oxide thin-film transistor has first and second terminals that are respectively connected to the first and second contacts.

12. A display, comprising:

inorganic light-emitting diodes; and an array of pixel control circuits each of which supplies drive currents to an associated set of the inorganic light-emitting diodes, wherein each pixel control circuit includes a silicon integrated circuit that supplies the drive currents and includes thin-film semiconducting oxide transistors that supply signals to the silicon integrated circuit, wherein the silicon integrated circuit is positioned above the thin-film semiconducting oxide transistors such that the silicon integrated circuit overlaps the thin-film semiconducting oxide transistors, and wherein the silicon integrated circuit comprises contacts that are soldered to source-drain contacts of the thin-film semiconducting oxide transistors.

13. The display defined in claim 12 wherein the thin-film semiconducting oxide transistors comprise switching transistors that are controlled by scan line signals from scan lines and wherein the signals supplied to the silicon integrated circuit comprises data signals.

14. The display defined in claim 12, wherein the display further comprises a substrate, wherein the inorganic light-emitting diodes are mounted on a surface of the substrate, wherein the silicon integrated circuit is mounted on the surface of the substrate, and wherein the thin-film semiconducting oxide transistors are formed on the surface of the substrate.

* * * * *